(12) United States Patent
Lee et al.

(10) Patent No.: US 11,842,982 B2
(45) Date of Patent: Dec. 12, 2023

(54) SEMICONDUCTOR PACKAGE WITH CURING LAYER BETWEEN SEMICONDUCTOR CHIPS

(71) Applicant: SAMSUNG ELECTRONICS CO., LTD., Suwon-si (KR)

(72) Inventors: Seon Ho Lee, Cheonan-si (KR); Hwail Jin, Seongnam-si (KR); Jongpa Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/329,230

(22) Filed: May 25, 2021

(65) Prior Publication Data

US 2022/0139873 A1    May 5, 2022

(30) Foreign Application Priority Data

Nov. 2, 2020    (KR) .......................... 10-2020-0144540

(51) Int. Cl.
*H01L 25/065*    (2023.01)
*H01L 25/00*    (2006.01)

(52) U.S. Cl.
CPC .......... *H01L 25/0652* (2013.01); *H01L 25/50* (2013.01); *H01L 2225/06513* (2013.01); *H01L 2225/06541* (2013.01); *H01L 2225/06586* (2013.01)

(58) Field of Classification Search
CPC ............. H01L 25/0652; H01L 25/0657; H01L 2225/06513–0652; H01L 2225/06541; H01L 2225/06586
See application file for complete search history.

(56) References Cited

U.S. PATENT DOCUMENTS

| | | | |
|---|---|---|---|
| 7,081,675 B2 | 7/2006 | Yim et al. | |
| 7,588,964 B2 | 9/2009 | Kwon et al. | |
| 7,683,482 B2 * | 3/2010 | Nishida | H01L 24/48 257/E21.511 |
| 7,749,806 B2 | 7/2010 | Shen et al. | |
| 8,653,676 B2 * | 2/2014 | Kim | H01L 24/97 257/790 |

(Continued)

FOREIGN PATENT DOCUMENTS

| | | | |
|---|---|---|---|
| JP | 2020-72149 A | | 5/2020 |
| JP | 2020072149 A | * | 5/2020 |

*Primary Examiner* — Bradley Smith
*Assistant Examiner* — William Henry Anderson
(74) *Attorney, Agent, or Firm* — Muir Patent Law, PLLC

(57) ABSTRACT

A semiconductor package includes a lower semiconductor chip having a lower semiconductor substrate and upper pads on a top surface of the lower semiconductor substrate, an upper semiconductor chip stacked on the lower semiconductor chip, the upper semiconductor chip including an upper semiconductor substrate and solder bumps on a bottom surface of the upper semiconductor substrate, and a curing layer between the lower semiconductor chip and the upper semiconductor chip, the curing layer including a first curing layer adjacent to the upper semiconductor chip, the first curing layer including a first photo-curing agent, and a second curing layer between the first curing layer and the top surface of the lower semiconductor substrate, the second curing layer including a first thermo-curing agent.

17 Claims, 13 Drawing Sheets

(56) References Cited

U.S. PATENT DOCUMENTS

| | | |
|---|---|---|
| 9,190,381 B2 | 11/2015 | Kojima |
| 9,202,755 B2 | 12/2015 | Moriyama |
| 9,376,541 B2 | 6/2016 | Kang et al. |
| 2009/0137082 A1 | 5/2009 | Kurita |
| 2014/0346684 A1* | 11/2014 | Kojima .................. H01L 24/30 |
| | | 438/118 |
| 2017/0012022 A1 | 1/2017 | Yoshida et al. |
| 2017/0233599 A1 | 8/2017 | Tanikawa et al. |
| 2018/0012866 A1* | 1/2018 | Choi ..................... H01L 21/563 |
| 2018/0312731 A1 | 11/2018 | Honda et al. |
| 2019/0027450 A1* | 1/2019 | Choi .................. H01L 23/3135 |
| 2019/0096856 A1* | 3/2019 | Hwang ............... H01L 25/0655 |
| 2019/0259743 A1* | 8/2019 | Han .................... H01L 25/0657 |

* cited by examiner

SEMICONDUCTOR PACKAGE WITH CURING LAYER BETWEEN SEMICONDUCTOR CHIPS

CROSS-REFERENCE TO RELATED APPLICATIONS

Korean Patent Application No. 10-2020-0144540, filed on Nov. 2, 2020, in the Korean Intellectual Property Office, and entitled: "Semiconductor Package," is incorporated by reference herein in its entirety.

BACKGROUND

1. Field

The present disclosure relates to a semiconductor package, and in particular, to a semiconductor package fabricated using a processing tape.

2. Description of the Related Art

With the development of the electronic industry, it becomes possible to cost-effectively manufacture light, small, fast, and high-performance electronic products. The semiconductor device may be manufactured in the form of a stack including a plurality of vertically-stacked semiconductor chips. A processing tape, e.g., a non-conductive film, may be used in a process of forming the stack of the semiconductor chips.

SUMMARY

According to an embodiment, a semiconductor package may include a lower semiconductor chip having a lower semiconductor substrate and upper pads provided on a top surface of the lower semiconductor substrate, an upper semiconductor chip stacked on the lower semiconductor chip, the upper semiconductor chip including an upper semiconductor substrate and solder bumps provided on a bottom surface of the upper semiconductor substrate, and a curing layer interposed between the lower semiconductor chip and the upper semiconductor chip. The curing layer may include a first curing layer adjacent to the upper semiconductor chip, and a second curing layer interposed between the first curing layer and the top surface of the lower semiconductor substrate. The first curing layer may include a first photo-curing agent, and the second curing layer may include a first thermo-curing agent.

According to another embodiment, a semiconductor package may include a lower semiconductor chip having a lower semiconductor substrate and upper pads provided on a top surface of the lower semiconductor substrate, an upper semiconductor chip stacked on the lower semiconductor chip, the upper semiconductor chip including an upper semiconductor substrate and solder bumps provided on a bottom surface of the upper semiconductor substrate, and a curing layer interposed between the lower semiconductor chip and the upper semiconductor chip. The curing layer may include a first curing layer adjacent to the upper semiconductor chip and a second curing layer interposed between the first curing layer and the top surface of the lower semiconductor substrate. The first curing layer may include a first thermo-curing agent, the second curing layer may include a second thermo-curing agent, and a curing temperature of the first thermo-curing agent may be lower than a curing temperature of the second thermo-curing agent.

According to yet another embodiment, a semiconductor package may include an interposer substrate, outer connection terminals disposed on a bottom surface of the interposer substrate, chip stacks mounted on the interposer substrate, the chip stacks including semiconductor chips and curing layers, which are vertically and alternately stacked, and a mold layer provided on the interposer substrate to cover side surfaces of the chip stacks and a top surface of the interposer substrate. Each of the semiconductor chips may include a semiconductor substrate, a penetration structure penetrating the semiconductor substrate, a circuit insulating layer and interconnection lines provided on a bottom surface of the semiconductor substrate, a lower pad connected to the interconnection lines, an upper pad provided on the semiconductor substrate, and a solder bump provided on a bottom surface of the lower pad. The penetration structure may connect the upper pad to the interconnection lines. The curing layer may include a first curing layer in contact with an upper portion of the solder bump of one of the semiconductor chips and a second curing layer in contact with a lower portion of the solder bump of the one of the semiconductor chips. The first curing layer may include a photo-curing agent, and the second curing layer may include a thermo-curing agent.

BRIEF DESCRIPTION OF THE DRAWINGS

Features will become apparent to those of skill in the art by describing in detail exemplary embodiments with reference to the attached drawings, in which.

DETAILED DESCRIPTION

Figure 1:
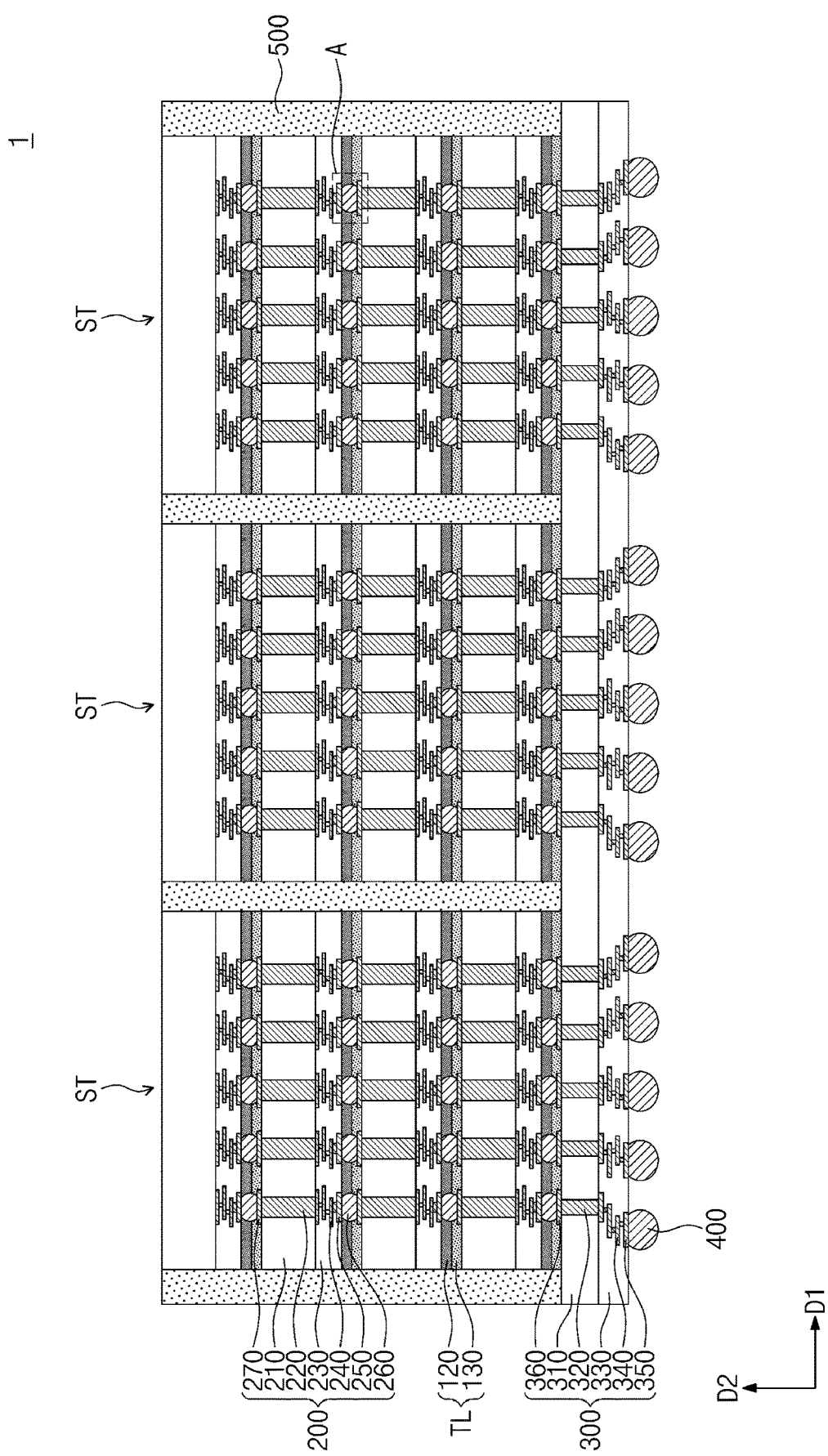
FIG. 1 is a cross-sectional view of a semiconductor package according to an embodiment.
Figure 2:
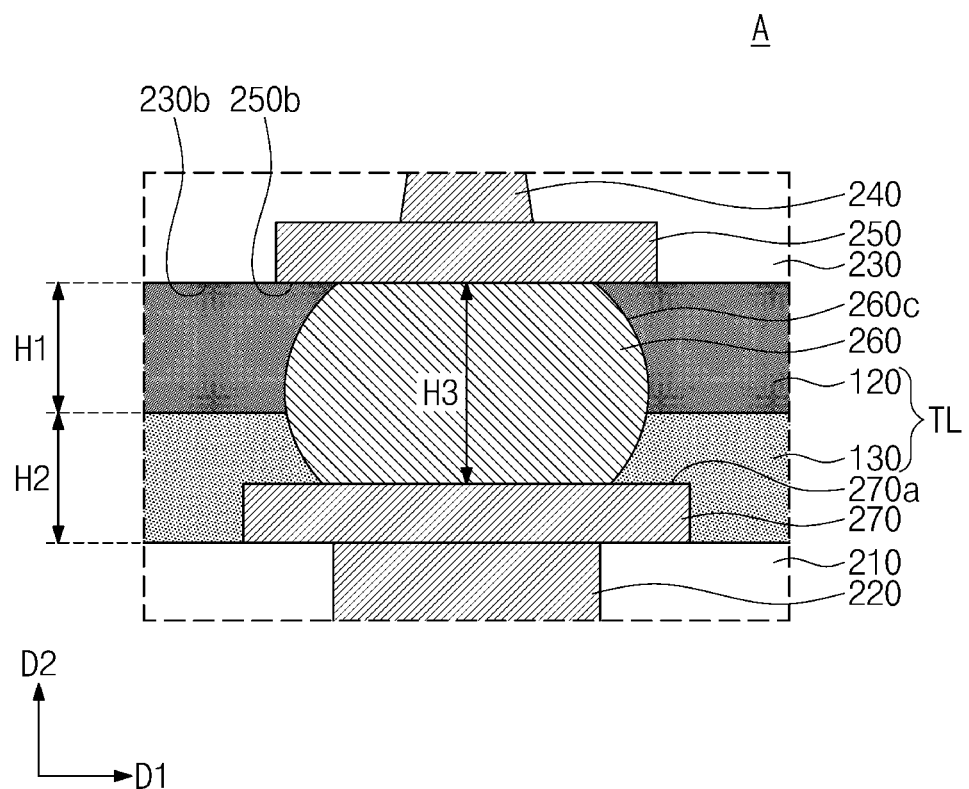
FIG. 2 is an enlarged cross-sectional view of portion A of FIG. 1.

FIG. 1 is a cross-sectional view of a semiconductor package according to an embodiment. FIG. 2 is an enlarged cross-sectional view of portion A of FIG. 1.

Referring to FIG. 1, a semiconductor package 1 may include chip stacks ST, an interposer substrate 300, a mold layer 500, and outer connection terminals 400. Each of the chip stacks ST may include a plurality of semiconductor chips 200 and a plurality of curing layers TL, which are vertically and alternately stacked.

The interposer substrate 300 may include an intermediate layer 310, a conductive post 320, an interposer insulating layer 330, an internal line 340, an outer terminal pad 350, and a chip connection pad 360. The intermediate layer 310 may include a plurality of stacked layers. The chip connection pad 360 may be provided on a top surface of the intermediate layer 310, and may be connected to the chip stack ST. The internal line 340 may be disposed in the interposer insulating layer 330, and may be connected to the outer terminal pad 350. The conductive post 320 may be provided to penetrate the intermediate layer 310 to connect the chip connection pad 360 to the internal line 340. In the present specification, the expression "two elements are electrically connected or coupled to each other" means that the elements are directly connected or coupled to each other or are indirectly connected or coupled to each other through other conductive elements. The expression "an element is electrically connected to the interposer substrate 300" means that the element is electrically connected to the internal line 340. The outer terminal pad 350, the internal line 340, the conductive post 320, and the chip connection pad 360 may be formed of or include at least one metallic material, e.g., at least one of copper, aluminum, tungsten, and/or titanium. In an embodiment, the interposer substrate 300 may be a printed circuit board (PCB). Alternatively, a redistribution layer may be used as the interposer substrate 300.

The outer connection terminals 400 may be provided on a bottom surface of the interposer substrate 300. In detail, the outer connection terminals 400 may be respectively provided on bottom surfaces of the outer terminal pads 350 of the interposer substrate 300. The outer connection terminals 400 may include solder balls. The outer connection terminals 400 may be formed of or include at least one solder material, e.g., at least one of tin (Sn), silver (Ag), zinc (Zn), and/or alloys thereof.

The chip stacks ST may be mounted on the interposer substrate 300, e.g., the chip stacks ST may be spaced apart from each other along a first direction D1. The mold layer 500 may be provided on a top surface of the interposer substrate 300 to fill a gap region between adjacent ones of the chip stacks ST. The mold layer 500 may protect the chip stacks ST from an external impact and may electrically separate the chip stacks ST from the outside. For the sake of simplicity, the description that follows will refer to just one chip stack ST.

The chip stack ST may include the semiconductor chips 200 and the curing layers TL, which are vertically stacked, e.g., along a second direction D2. The curing layers TL may be interposed between the semiconductor chips 200, e.g., one curing layer TL may be between two semiconductor chips 200 adjacent to each other along the second direction D2, and between the interposer substrate 300 and the lowermost one of the semiconductor chips 200. For the sake of simplicity, the description that follows will refer to just one semiconductor chip 200 and just one curing layer TL.

The semiconductor chip 200 may include high bandwidth memory (HBM) chips. The semiconductor chip 200 may include a semiconductor substrate 210, a penetration structure 220, a circuit insulating layer 230, interconnection lines 240, a lower pad 250, a solder bump 260, and an upper pad 270.

The semiconductor substrate 210 may be formed of or include a semiconductor material, e.g., silicon, germanium, or silicon-germanium. The semiconductor substrate 210 may have bottom and top surfaces that are opposite to each other, e.g., a bottom surface of the semiconductor substrate 210 may face the interposer substrate 300.

The circuit insulating layer 230 and the interconnection lines 240 may be provided on the bottom surface of the semiconductor substrate 210. Integrated circuits may be provided in the circuit insulating layer 230. The integrated circuits may be provided on the bottom surface of the semiconductor substrate 210 and may include transistors. The circuit insulating layer 230 may be formed of or include at least one of, e.g., silicon oxide, silicon nitride, or silicon oxynitride. The interconnection lines 240 may be electrically connected to the integrated circuits and the penetration structure 220. The interconnection lines 240 may be formed of or include at least one conductive material, e.g., at least one of copper and/or tungsten. A bottom surface 230*b* of the circuit insulating layer 230 may serve as the bottom surface 230*b* of the semiconductor chip 200. As an example, as illustrated in FIG. 2, the bottom surface 230*b* of the circuit insulating layer 230 may be coplanar with a bottom surface 250*b* of the lower pad 250. In another example, the bottom surface 230*b* of the circuit insulating layer 230 may be at a level higher than the bottom surface 250*b* of the lower pad 250.

The upper pad 270 may be provided on the top surface of the semiconductor substrate 210. The upper pad 270 may be connected to the penetration structure 220. The lower pad 250 may be provided on a bottom surface of the circuit insulating layer 230. The lower pad 250 may be connected to the solder bump 260. The upper pad 270 and the lower pad 250 may be formed of or include at least one conductive material, e.g., at least one of aluminum, gold, and/or copper. In an embodiment, a plurality of the upper pads 270 and a plurality of the lower pads 250 may be provided in the semiconductor package 1.

The penetration structure 220 may be provided in the semiconductor substrate 210. For example, the penetration structure 220 may be provided to penetrate the, e.g., entire thickness of the, semiconductor substrate 210. The penetration structure 220 may be electrically connected to the lower pad 250 or the integrated circuits through the interconnection lines 240. The penetration structure 220 may be formed of or include at least one conductive material, e.g., at least one of copper, titanium, or tungsten. In an embodiment, a plurality of the penetration structures 220 may be provided.

The solder bumps 260 may be provided on bottom surfaces of the lower pads 250, respectively. The solder bumps 260 may include, e.g., solder balls, solder bumps, solder pillars, or any combinations thereof. The solder bumps 260 may be formed of or include at least one conductive materials, e.g., at least one of tin, lead, silver, and alloys thereof. The solder bumps 260 may be connected to the integrated circuits or the penetration structures 220 through the interconnection lines 240.

The semiconductor chips 200 of each of the chip stacks ST may include, e.g., at least a lower semiconductor chip 200 and an upper semiconductor chip 200, which are disposed adjacent to each other, e.g., along the second direction D2. For example, as illustrated in FIG. 1, each of the chip stacks ST may include a plurality of semiconductor chips 200, e.g., four semiconductor chips 200, stacked on top of each other along the second direction D2 with the curing layers TL alternating therewith. The upper semiconductor chip 200 may be disposed on the lower semiconductor chip 200. The solder bumps 260 of the upper semiconductor chip 200 may be electrically and respectively connected to the upper pads 270 of the lower semiconductor chip 200.

Hereinafter, the curing layers TL will be described in more detail with reference to FIG. 2.

Referring to FIGS. 1 and 2, one of the curing layers TL may be interposed between the lower semiconductor chip 200 and the upper semiconductor chip 200, i.e., between two semiconductor chips 200 stacked on top of each other. The curing layer TL may be provided to fill a gap region between the lower semiconductor chip 200 and the upper semiconductor chip 200. The curing layer TL may also be provided to surround, e.g., an entire perimeter of each of, the solder bumps 260 of the upper semiconductor chip 200. The curing layer TL may include a first curing layer 120 and a second curing layer 130, which is interposed between the first curing layer 120 and a top surface of the lower semiconductor chip.

The first curing layer 120 may be provided between the second curing layer 130 and the bottom surface 230b of the upper semiconductor chip 200. The first curing layer 120 may be provided to be in contact with an upper portion of the solder bump 260 of the upper semiconductor chip 200, at least a portion of the bottom surface 250b of the lower pad 250 of the upper semiconductor chip 200, and the bottom surface 230b of the circuit insulating layer 230. A thickness H1 of the first curing layer 120 in the second direction D2 may range from 0.1 µm to 20 µm. In the present specification, the first direction D1 may be a direction parallel to the top surface of the interposer substrate 300, and the second direction D2 may be a direction perpendicular to the top surface of the interposer substrate 300.

The first curing layer 120 may include a first polymer resin and first filler particles. The first curing layer 120 may further include at least one of a first photo-curing agent and a first thermo-curing agent. The first polymer resin may include, e.g., acrylate-based polymers, epoxy-based polymers, and/or poly(bismaleimide)-based polymers. The first filler particles may include, e.g., silica particles and/or alumina particles. The content of the first filler particles in the first curing layer 120 may range from about 20 wt % to about 70 wt %, based on a total weight of the first curing layer 120. The first filler particles may have a mean width, e.g., diameter, ranging from about 10 nm to about 10 µm. The first photo-curing agent may be a photo-initiator. The content of the first photo-curing agent in the first curing layer 120 may range from about 0.1 to about 5 parts per hundred resin (phr), e.g., about 0.1 to about 5 parts per hundred parts by weight of the first polymer resin. The first photo-curing agent may include, e.g., Azo compound, Azobisisobutyronitrile (AIBN), benzoyl peroxide, Irgacure Nos. 184, 651, 819, 651, 784, 907, 2959, 754, or the like. For example, the first thermo-curing agent may include peroxide-based materials.

The second curing layer 130 may be in contact with a lower portion of the solder bump 260 of the upper semiconductor chip 200, at least a portion of a top surface 270a and a side surface of the upper pad 270 of the lower semiconductor chip 200, and the top surface of the semiconductor substrate 210. A thickness H2 of the second curing layer 130 in the second direction D2 may range from about 0.1 µm to about 20 µm.

The second curing layer 130 may be formed of or include a material that is different from the material of the first curing layer 120. For example, the second curing layer 130 may include a second polymer resin, second filler particles, and a second thermo-curing agent. The second polymer resin may be substantially the same as the first polymer resin of the first curing layer 120 described above. The second filler particles in the second curing layer 130 may be substantially the same as the first filler particles in the first curing layer 120 described above. The second thermo-curing agent may be formed of or include at least one of amine-based materials (e.g., imidazole). The content of the second thermo-curing agent in the second curing layer 130 may range from about 1 to about 30 phr, e.g., about 1 to about 30 parts per hundred parts by weight of the second polymer resin.

An interface between the first curing layer 120 and the second curing layer 130 may be observable or not. In the case where the interface between the first curing layer 120 and the second curing layer 130 is observable, e.g., visually detectable, the interface between the first curing layer 120 and the second curing layer 130 may be located at a level between top and bottom surfaces of the solder bump 260 of the upper semiconductor chip 200. A height H3 of the solder bump 260 in the second direction D2 may range from about 0.5 µm to about 10 µm. A ratio of the thickness H1 of the first curing layer 120 to the height H3 of the solder bump 260 may range from about 0.1 to about 1, and a ratio of the thickness H2 of the second curing layer 130 to the height H3 of the solder bump 260 may range from about 0.1 to about 1.

Figure 4:
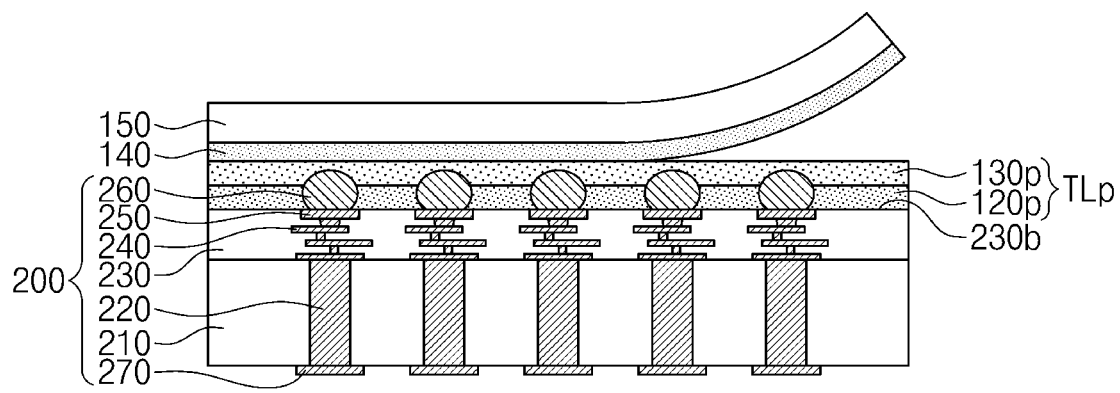
Figure 5:
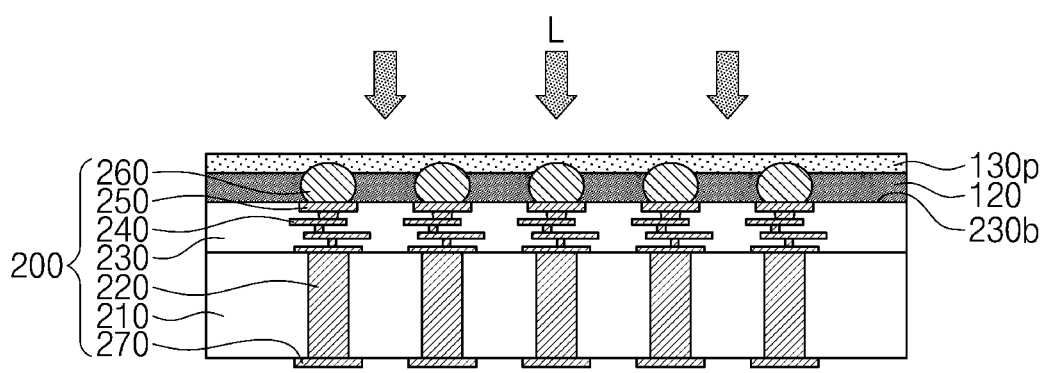
Figure 6:
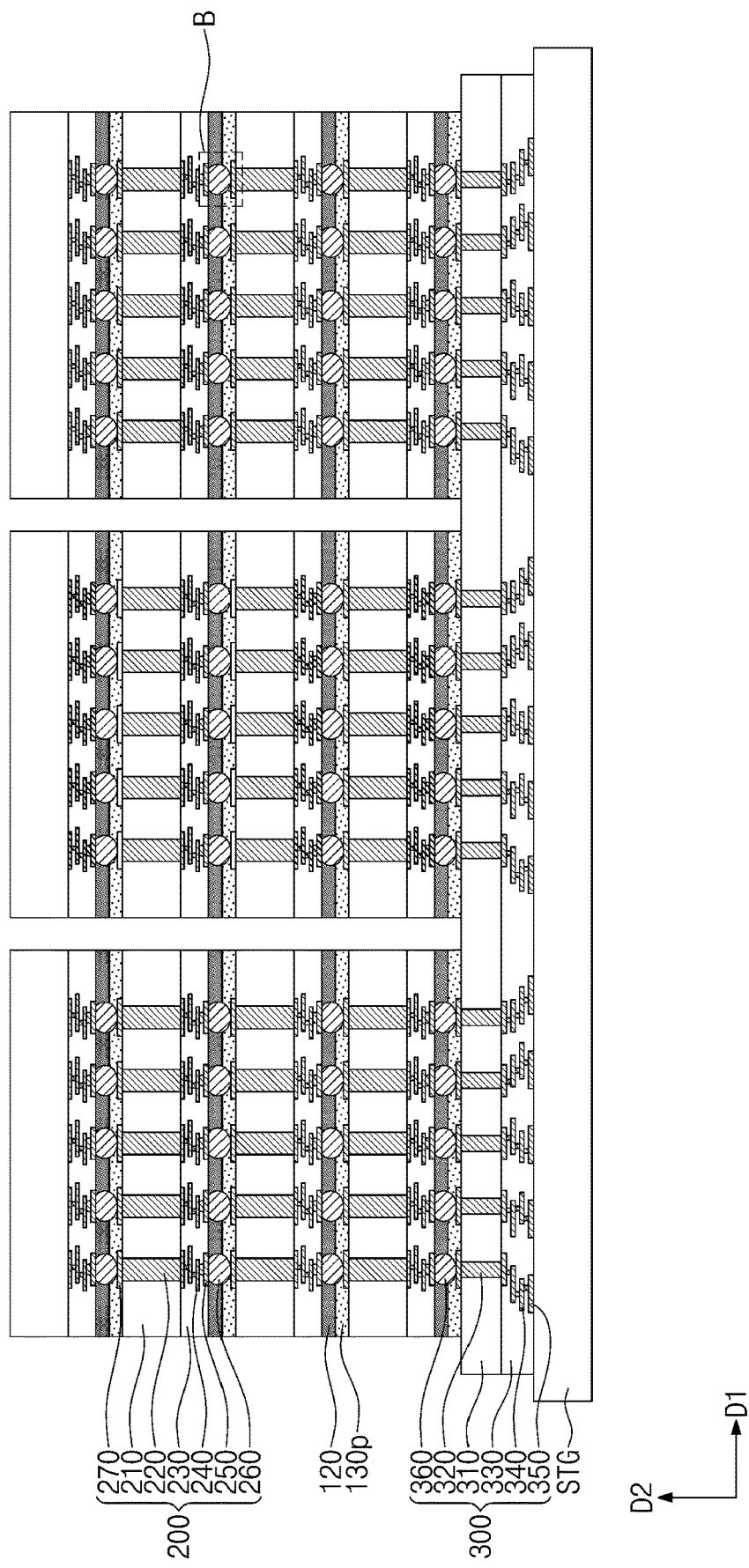
Figure 7:
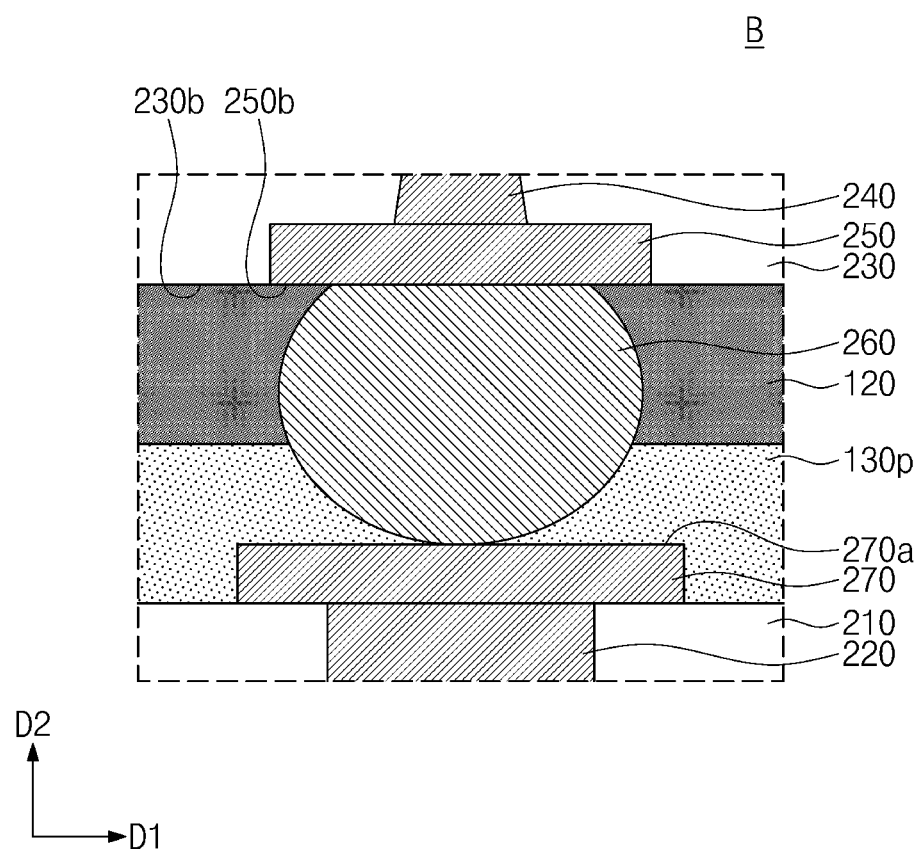
FIG. 7 is an enlarged cross-sectional view of portion B of FIG. 6.

FIGS. 3 to 6 and 8 are cross-sectional views of stages in a method of fabricating a semiconductor package, according to an embodiment FIG. 7 is an enlarged cross-sectional view of portion B of FIG. 6.

Figure 3:
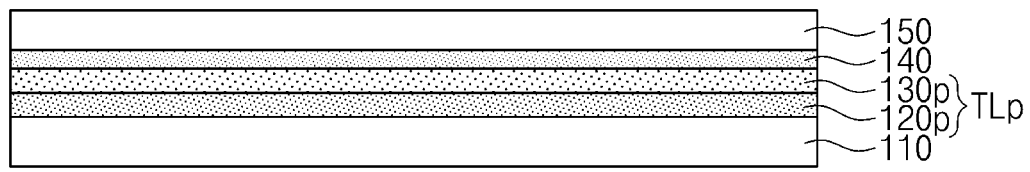
FIGS. 3 to 6 and 8 are cross-sectional views of stages in a method of fabricating a semiconductor package, according to an embodiment.

Referring to FIG. 3, a processing tape 10 may be prepared. The processing tape 10 may include a protection release film 110, a preliminary curing layer TLp, an adhesive layer 140, and a base film 150. The preliminary curing layer TLp may include a first preliminary curing layer 120p and a second preliminary curing layer 130p. The processing tape 10 may be used in a process of stacking the semiconductor chips 200.

The protection release film 110 may be formed of or include at least one organic material (e.g., polymer). For example, the protection release film 110 may be formed of or include at least one of polyethyleneterephthalate (PET), poly olefin (PO), poly(vinyl alcohol) (PVA), poly(1-naphthylamine) (PNA), polyether ether ketone (PEEK), and/or mixtures thereof. The protection release film 110 may protect the preliminary curing layer TLp from a physical stress. The physical stress may be an external impact, but embodiments are not limited to this example. The protection release film 110 may be removed before using the processing tape 10. An example, in which the processing tape 10 is used, will be described with reference to FIGS. 4 to 8.

The preliminary curing layer TLp may be provided on the protection release film 110. The preliminary curing layer TLp may include the first preliminary curing layer 120p and the second preliminary curing layer 130p. The first preliminary curing layer 120p may be provided on the protection release film 110, and the second preliminary curing layer 130p may be provided between the first preliminary curing layer 120p and the adhesive layer 140. The first preliminary curing layer 120p may have a thickness ranging from about 0.1 µm to about 20 µm, and the second preliminary curing layer 130p may have a thickness ranging from about 0.1 µm to about 20 µm. Each of the first preliminary curing layer 120p and the second preliminary curing layer 130p may have both of adhesive and fluidic properties.

For example, the first preliminary curing layer 120p may have a photo-curing property, and the second preliminary curing layer 130p may have a thermo-curing property. In detail, the first preliminary curing layer 120p may include the first polymer resin, the first filler particles, and the first photo-curing agent. The first polymer resin may include, e.g., acrylate-based polymers, epoxy-based polymers, and/or poly(bismaleimide)-based polymers. The first filler particles may include, e.g., silica particles and/or alumina particles. The content of the first filler particles in the first preliminary curing layer 120p may range from about 20 wt % to about 70 wt %, based on a total weight of the first preliminary curing layer 120p. The first filler particles may have a mean width ranging from about 10 nm to about 10 µm. The first photo-curing agent may be a photo-initiator. The content of the first photo-curing agent in the first preliminary curing layer 120p may range from about 0.1 phr to about 5 phr. The first photo-curing agent may include, e.g., Azo compound, Azobisisobutyronitrile (AIBN), benzoyl peroxide, Irgacure Nos. 184, 651, 819, 651, 784, 907, 2959, 754, or the like. In the case where the first photo-curing agent is irradiated with light of a specific wavelength (e.g., an ultraviolet light having a wavelength of about 10 nm to about 400 nm), the first photo-curing agent may cure the first preliminary curing layer 120*p*. In detail, the first photo-curing agent may produce radicals, which initiates, e.g., activates, a radical polymerization process, when it is irradiated with the light of the specific wavelength. As a chemical reaction by the radicals is carried out, the first preliminary curing layer 120*p* may become cured.

The second preliminary curing layer 130*p* may include the second polymer resin, the second filler particles, and the second thermo-curing agent. The second polymer resin may be substantially the same as the first polymer resin described above. The second filler particles in the second preliminary curing layer 130*p* may be substantially the same as the first filler particles in the first preliminary curing layer 120*p* described above. The second thermo-curing agent may be formed of or include at least one of amine-based materials (e.g., imidazole). The content of the second thermo-curing agent in the second preliminary curing layer 130*p* may range from about 1 phr to about 30 phr. The second thermo-curing agent may be used to cure the second preliminary curing layer 130*p*, when the temperature is within a specific temperature range. For example, if the temperature is within a range from about 150° C. to about 300° C., the second preliminary curing layer 130*p* may be cured by the second thermo-curing agent.

In another example, the first preliminary curing layer 120*p* and the second preliminary curing layer 130*p* may both have a thermo-curing property, but they may have different curing temperatures from each other. The first preliminary curing layer 120*p* may include a first thermo-curing agent that is of a different kind, as compared to the second preliminary curing layer 130*p*. Accordingly, the curing temperature of the first preliminary curing layer 120*p* may be different from the curing temperature of the second preliminary curing layer 130*p*. For example, the curing temperature of the first preliminary curing layer 120*p* may be lower than the curing temperature of the second preliminary curing layer 130*p*.

In detail, the first preliminary curing layer 120*p* may include the first polymer resin, the first filler particles, and the first thermo-curing agent. The first polymer resin and the first filler particles may be substantially the same as described above. The content of the first thermo-curing agent in the first preliminary curing layer 120*p* may range from about 0.1 phr to about 5 phr. In an embodiment, the first thermo-curing agent may be formed of or include at least one of peroxide-based materials. The photo-curing agent may be used to cure the first preliminary curing layer 120*p*, under a specific temperature condition. For example, when the temperature is within a range from about 80° C. to about 150° C., the first preliminary curing layer 120*p* may be cured by the first thermo-curing agent.

The second preliminary curing layer 130*p* may include the second polymer resin, the second filler particles, and the second thermo-curing agent. The second polymer resin may be substantially the same as the first polymer resin described above. The second filler particles in the second preliminary curing layer 130*p* may be substantially the same as the first filler particles described above. The second thermo-curing agent may be formed of or include at least one of amine-based materials (e.g., imidazole), as described above. The content of the second thermo-curing agent in the second preliminary curing layer 130*p* may range from about 1 phr to about 30 phr. The second thermo-curing agent may be used to cure the second preliminary curing layer 130*p*, when the temperature is within a specific temperature range. For example, if the temperature is within a range from about 150° C. to about 300° C., the second preliminary curing layer 130*p* may be cured by the second thermo-curing agent.

The adhesive layer 140 may be provided on the preliminary curing layer TLp. The adhesive layer 140 may be, e.g., a pressure sensitive adhesive layer. The adhesive layer 140 may be formed of or include a photo-curable material, e.g., the photo-curable material may be in a non-cured state. The photo-curable material in the adhesive layer 140 may include a polymer, and the polymer may include an alkyne group and an alcohol (—OH) group. For example, the adhesive layer 140 may be formed of or include at least one of acrylate-based materials (e.g., acrylate polymer). The adhesive layer 140 may further include at least one of a cross-linking agent, a photo-curing agent, or an additive agent. The additive agent may include at least one of a UV absorption agent or a coating leveling agent. The UV absorption agent may include a material having an aromatic ring structure or a conjugate structure. For example, the UV absorption agent may include benzophenone and/or derivatives thereof. The coating leveling agent may include at least one of silicone-based surfactants.

The base film 150 may be provided on the adhesive layer 140. The base film 150 may be formed of or include at least one of organic materials (e.g., polymer). For example, the base film 150 may be formed of or include at least one of polyethyleneterephthalate (PET), poly olefin (PO), poly (vinyl alcohol) (PVA), poly(1-naphthylamine) (PNA), polyether ether ketone (PEEK), and/or mixtures thereof. In an embodiment, the base film 150 may be formed of or include at least one of homo-polymers or blend polymers. The base film 150 may have a single- or multi-layered structure.

Referring to FIG. 4, the semiconductor chip 200 may be prepared. The semiconductor chip 200 may be substantially the same as the semiconductor chip 200 described with reference to FIG. 2. The first preliminary curing layer 120*p* may be exposed by removing the protection release film 110 from the processing tape 10 (in FIG. 3). The processing tape 10, from which the protection release film 110 is removed, may be disposed on the bottom surface 230*b* of the semiconductor chip 200 (in FIG. 4). Here, the semiconductor chip 200 may be disposed such that the bottom surface 230*b* faces the first preliminary curing layer 120*p*.

In detail, the semiconductor chip 200 may be attached to the first preliminary curing layer 120*p* in such a way that the preliminary curing layer TLp is in contact with the solder bump 260 and the bottom surface 230*b* of the semiconductor chip 200. The processing tape 10 may cover a surface of the solder bump 260. Since the preliminary curing layer TLp of the processing tape 10 is in a non-cured state or is soft, the solder bump 260 may penetrate the preliminary curing layer TLp. In an embodiment, the solder bump 260 may penetrate the first preliminary curing layer 120*p* and a portion of the second preliminary curing layer 130*p*, e.g., the solder bump 260 may penetrate the entire first preliminary curing layer 120*p* and only a portion of the second preliminary curing layer 130*p*. Accordingly, a portion of the solder bump 260 may be placed in an inner portion of the preliminary curing layer TLp, e.g., so surfaces of the solder bump 260 above the lower pad 250 may be completely covered by the preliminary curing layer TLp. After attaching of the processing tape 10 to the semiconductor chip 200, e.g., after attaching the preliminary curing layer TLp to the semiconductor chip 200, the adhesive layer 140 and the base film 150 may be removed from the processing tape 10, e.g., so a surface of the second preliminary curing layer 130p is exposed.

Referring to FIG. 5, light L may be irradiated onto the processing tape 10, i.e., onto the preliminary curing layer TLp on the semiconductor chip 200. The light L may have a wavelength ranging from about 10 nm to about 400 nm or may be ultraviolet light. For example, the light L may be irradiated onto the preliminary curing layer TLp, e.g., onto the exposed second preliminary curing layer 130p. In the case where the first preliminary curing layer 120p includes the photo-curing agent, the first preliminary curing layer 120p may be cured in a photo-curing manner by the irradiation of the light L to form the first curing layer 120. Since the second preliminary curing layer 130p does not include a photo-initiator, the second preliminary curing layer 130p may not be cured by the irradiation of the light L.

Referring to FIG. 6, a stage STG may be prepared. The stage STG may be a flat plate, which is formed of or includes a metallic material. The stage STG may include a temperature adjusting system, which is provided therein and is used to adjust a surface temperature of the stage STG. The interposer substrate 300 may be placed on the stage STG. The interposer substrate 300 may be substantially the same as the interposer substrate 300 described with reference to FIG. 1. The semiconductor chip 200, to which the first curing layer 120 and the second preliminary curing layer 130p described with reference to FIG. 5 are attached, may be provided on the interposer substrate 300. Here, the semiconductor chip 200 may be disposed in such a way that the solder bump 260 is vertically aligned, e.g., along the second direction D2, with the chip connection pad 360 of the interposer substrate 300. Since the second preliminary curing layer 130p has an adhesive property, the second preliminary curing layer 130p may be attached to the top surface of the interposer substrate 300 and may be physically fixed to the interposer substrate 300.

An additional semiconductor chip 200, to which the first curing layer 120 and the second preliminary curing layer 130p are attached, may be provided on the semiconductor chip 200, which is attached to the interposer substrate 300, by repeating the process described with reference to FIGS. 4 to 5. Since the second preliminary curing layer 130p has an adhesive property, vertically adjacent ones of the semiconductor chips 200 may be physically fixed to each other. Here, as shown in FIG. 7, the solder bump 260 of the upper semiconductor chip 200 may be in contact with at least a portion of the top surface 270a of the upper pad 270 of the lower semiconductor chip 200. For example, referring to FIGS. 6-7, when the second preliminary curing layer 130p is pushed toward the lower semiconductor chip 200 to adhere thereto, the solder bump 260 may extend through the second preliminary curing layer 130p to at least partially contact the top surface 270a of the upper pad 270 of the lower semiconductor chip 200.

Preliminary chip stacks STp may be formed by repeating the stacking process several times. The preliminary chip stacks STp may be disposed to be horizontally spaced apart from each other. While repeating of the stacking process, a surface temperature of the stage STG may be maintained at, e.g., about 50° C.

Figure 8:
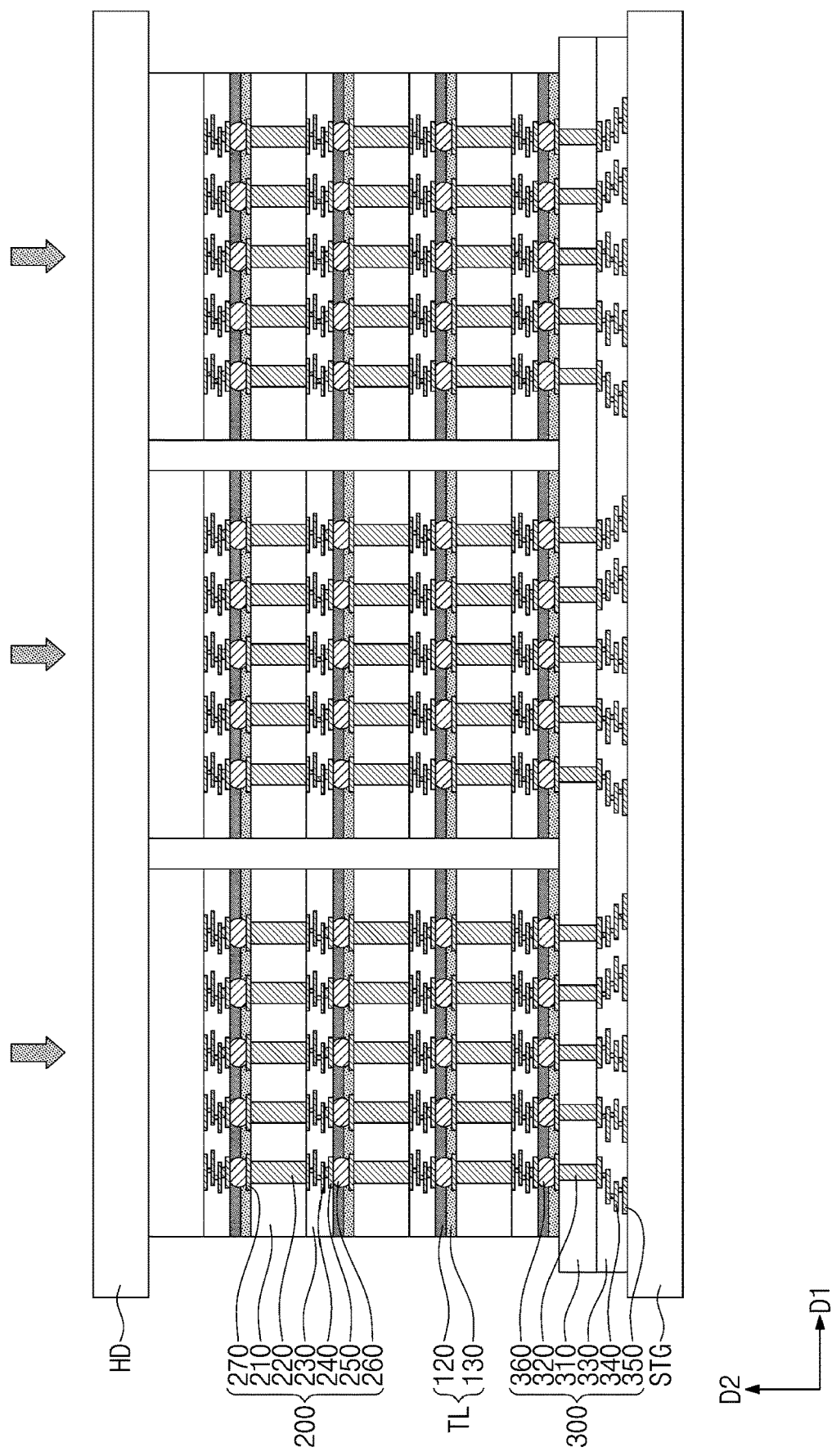

Referring to FIG. 8, a pressure head HD may be prepared on the preliminary chip stacks STp. The pressure head HD may be a flat plate, which is formed of or includes a metallic material. The pressure head HD may be configured to be movable in the vertical direction and may include a temperature adjusting system, which is used to adjust a surface temperature of the pressure head HD. The pressure head HD may be vertically moved to perform a first pressing and heating process. The first pressing and heating process may include applying both heat and pressure to the preliminary chip stacks STp. In detail, in the first pressing and heating process, the pressure head HD may be controlled to exert a pressure on the preliminary chip stacks STp in the vertical direction. During the exerting of the pressure, the temperature of the pressure head HD may be maintained within a range from about 200° C. to about 400° C., and the temperature of the stage STG may be maintained at about 70° C. Due to the heating of the pressure head HD and the stage STG, temperature near the preliminary chip stacks STp may be increased to be higher than the curing temperature of the thermo-curing agent in the second preliminary curing layer 130p. Accordingly, the solder bump 260 may be extended in a lateral direction between the lower pad 250 of the upper semiconductor chip 200 and the upper pad 270 of the lower semiconductor chip 200, e.g., in the first direction D1 to increase a contact area between the solder bump 260 and the upper pad 270, and may connect the lower pad 250 and the upper pad 270, which are adjacent to each other, e.g., in the second direction D2, as shown in FIG. 2. In addition, the second curing layer 130 may be formed by a curing reaction, e.g., due to the temperature of the pressure head HD, which is carried out in the second preliminary curing layer 130p, and the semiconductor chips 200 may be more robustly fixed by the curing layer TL to form the chip stacks ST.

According to an embodiment, before the first pressing and heating process, the first preliminary curing layer 120p may be cured in a photo-curing manner to form the first curing layer 120. In the case where the solder bump 260 is laterally expanded in the first pressing and heating process, the upper portion of the solder bump 260 in contact with the first curing layer 120 may not be expanded in a lateral direction or may be hardly expanded because the first curing layer 120 is hard, e.g., so only a portion of the solder bump 260 in the second preliminary curing layer 130p contacting the upper pad 270 may expand laterally. Accordingly, it may be possible to reduce a ratio of a short failure between adjacent ones of the solder bumps 260, which may occur when the solder bumps 260 are formed in a highly-integrated semiconductor package.

Furthermore, in general, when a pressing and heating process using the pressure head HD is performed on the preliminary chip stacks STp horizontally spaced apart from each other, a non-uniform pressure and heat could potentially be applied to a central part of the pressure head HD, e.g., as compared to edge portions of the pressure head HD. For example, the preliminary chip stack STp adjacent to the central portion of the pressure head HD may be subjected to higher pressure and higher temperature, e.g., as compared with the preliminary chip stack STp adjacent to the edge portion of the pressure head HD, thereby potentially causing further lateral expansion of solder bumps. In contrast, according to an embodiment, since the lateral expansion of the solder bumps 260 is restricted by the previously hardened first curing layer 120, it may be possible to prevent or substantially suppress lateral expansion of the solder bumps 260. As such, shorts between adjacent ones of the solder bumps 260 in the central portion of the pressure head HD may be prevented or substantially minimized, even when there is a non-uniformity in pressure and heat, which is caused by a variation in position on the pressure head HD, in the pressing and heating process on the preliminary chip stack STp.

Referring back to FIG. 1, the mold layer 500 may be formed on the interposer substrate 300. The mold layer 500 may be formed of or include at least one of epoxy-based polymers. The mold layer 500 may fill a gap region between the chip stacks ST and may cover side surfaces of each of the chip stacks ST and the top surface of the interposer substrate 300. The outer connection terminals 400 may be respectively formed on the bottom surfaces of the outer terminal pads 350 of the interposer substrate 300. Accordingly, the semiconductor package 1 according to an embodiment may be fabricated.

FIGS. 9 to 12 are cross-sectional views of stages in a method of fabricating a semiconductor package, according to an embodiment. For ease of description, a previously described element may be identified by the same reference number without repeating an overlapping description thereof.

Figure 9:
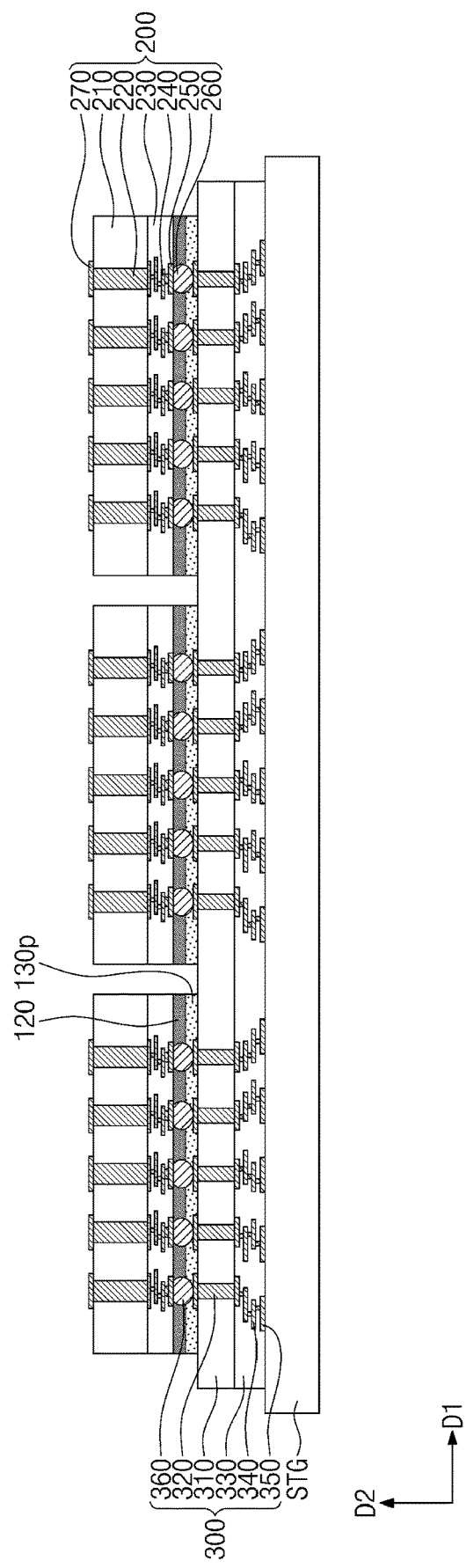
FIGS. 9 to 12 are cross-sectional views of stages in a method of fabricating a semiconductor package, according to an embodiment.

Referring to FIG. 9, the semiconductor chip 200 may be prepared by the same method as described previously with reference to FIGS. 3 to 5, and in this case, the first curing layer 120 and the second preliminary curing layer 130p may be attached to the bottom surface 230b of the semiconductor chip 200. The interposer substrate 300 may be prepared. The interposer substrate 300 may be substantially the same as the interposer substrate 300 described with reference to FIG. 1. The semiconductor chips 200, to which the first curing layer 120 and the second preliminary curing layer 130p are attached, may be stacked on the interposer substrate 300. The semiconductor chips 200 may be disposed to be horizontally spaced apart from each other and may be provided at the same level on the interposer substrate 300.

Figure 10:
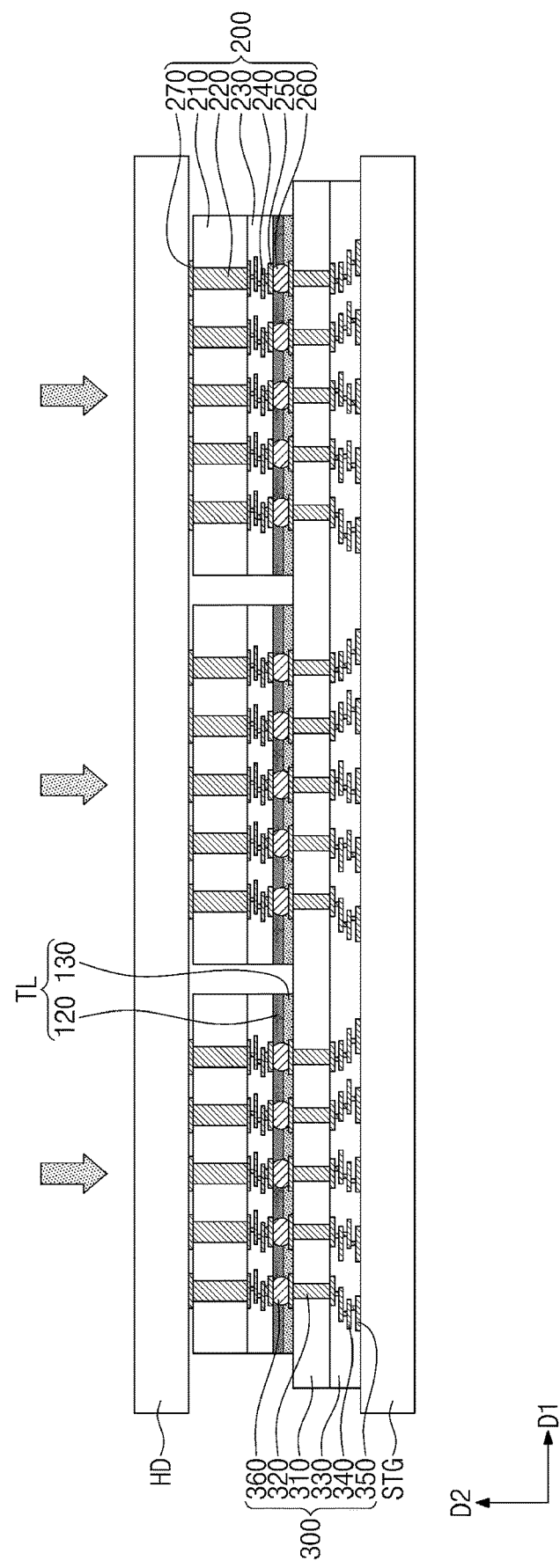

Referring to FIG. 10, the pressure head HD may be disposed on the semiconductor chips 200, which are horizontally spaced apart from each other. The pressure head HD may be vertically moved to perform the first pressing and heating process. In other words, the pressure head HD may be vertically moved to apply heat and pressure to top surfaces of the semiconductor chips 200. Here, the temperature of the pressure head HD may be maintained within a range from about 200° C. to about 400° C., and the temperature of the stage STG may be maintained at about 70° C. Due to the heating of the pressure head HD and the stage STG, the temperature near the semiconductor chips 200 may be increased to be higher than a curing temperature of the thermo-curing agent in the second preliminary curing layer 130p. Accordingly, the second curing layer 130 may be formed by a curing reaction, which is carried out in the second preliminary curing layer 130p, and the semiconductor chips 200 may be fixedly attached to the interposer substrate 300 by the curing layer TL.

Figure 11:
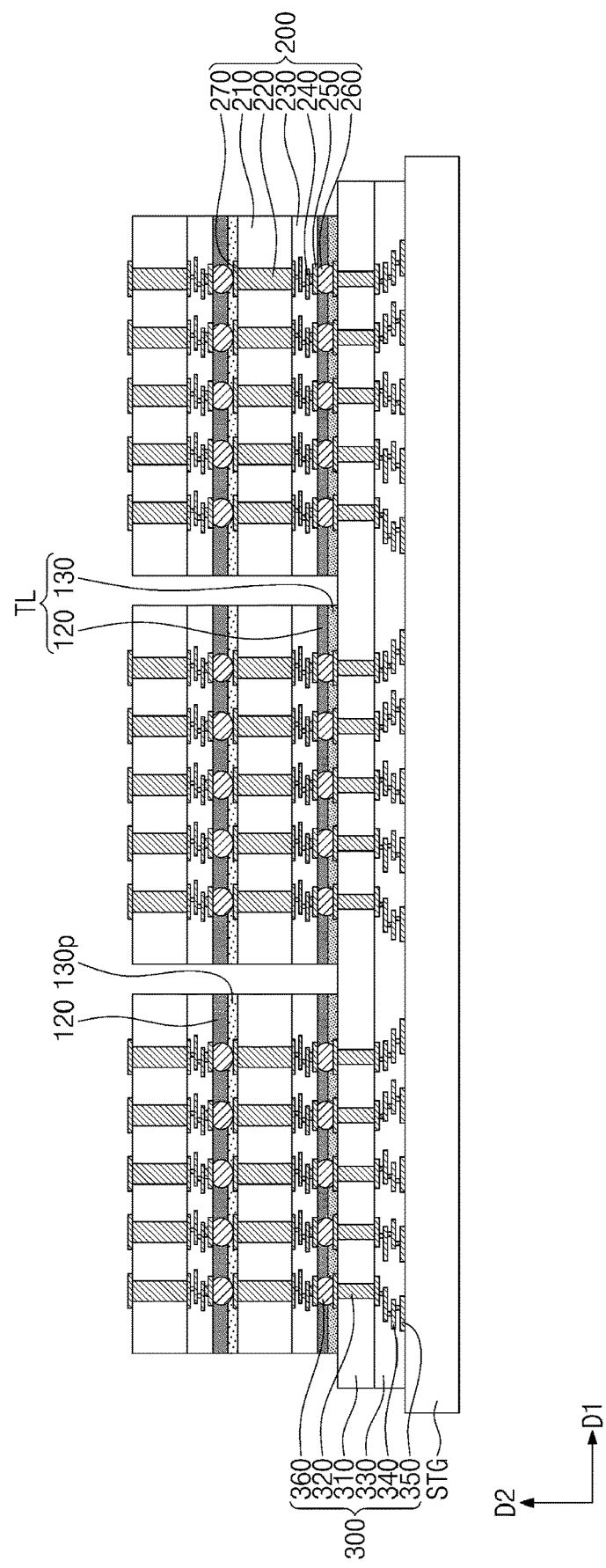

Referring to FIG. 11, the semiconductor chips 200, to which the first curing layer 120 and the second preliminary curing layer 130p are attached, may be respectively stacked on the semiconductor chips 200 that are fixedly attached to the interposer substrate 300. Since the second preliminary curing layer 130p has an adhesive property, the semiconductor chips 200 may be physically fixed to the semiconductor chips 200 which are fixedly attached to the interposer substrate 300.

Figure 12:
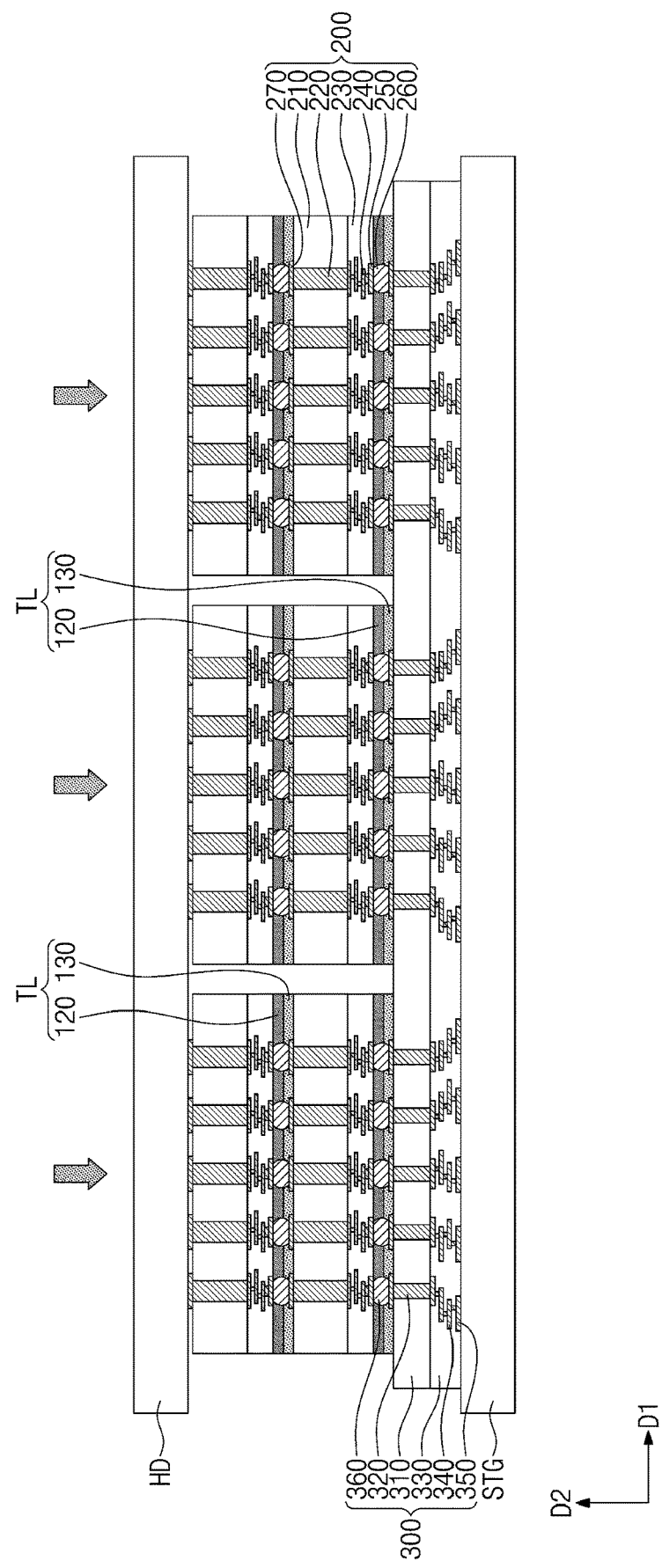

Referring to FIG. 12, the pressure head HD may be disposed on the semiconductor chips 200, which are stacked to form a double-layered structure. The pressure head HD may be vertically moved to perform a second pressing and heating process. In other words, the pressure head HD may be vertically moved to apply heat and pressure to top surfaces of the semiconductor chips 200, which are stacked to form the double-layered structure. Here, the temperature of the pressure head HD may be maintained within a range from about 200° C. to about 400° C., and the temperature of the stage STG may be maintained at about 70° C. Due to the heating of the pressure head HD and the stage STG, the temperature near the uppermost one of the semiconductor chips 200 may be increased to be higher than a curing temperature of the thermo-curing agent in the second preliminary curing layers 130p for the uppermost one of the semiconductor chips 200. Accordingly, the second curing layers 130 may be formed by a curing reaction, which is carried out in the second preliminary curing layers 130p for the uppermost one of the semiconductor chips 200, and the uppermost one of the semiconductor chips 200 may be fixedly attached to the lowermost one of the semiconductor chips 200 by the curing layer TL.

The stacking process of the semiconductor chips 200 and the pressing and heating process using the pressure head HD may be repeated using substantially the same method as described with reference to FIGS. 11 and 12, and in this case, the chip stack ST may be formed to have a multi-layered structure. Thereafter, the semiconductor package 1 according to an embodiment may be fabricated by forming the mold layer 500 and the outer connection terminals 400 using the method described with reference to FIG. 6.

Figure 13:
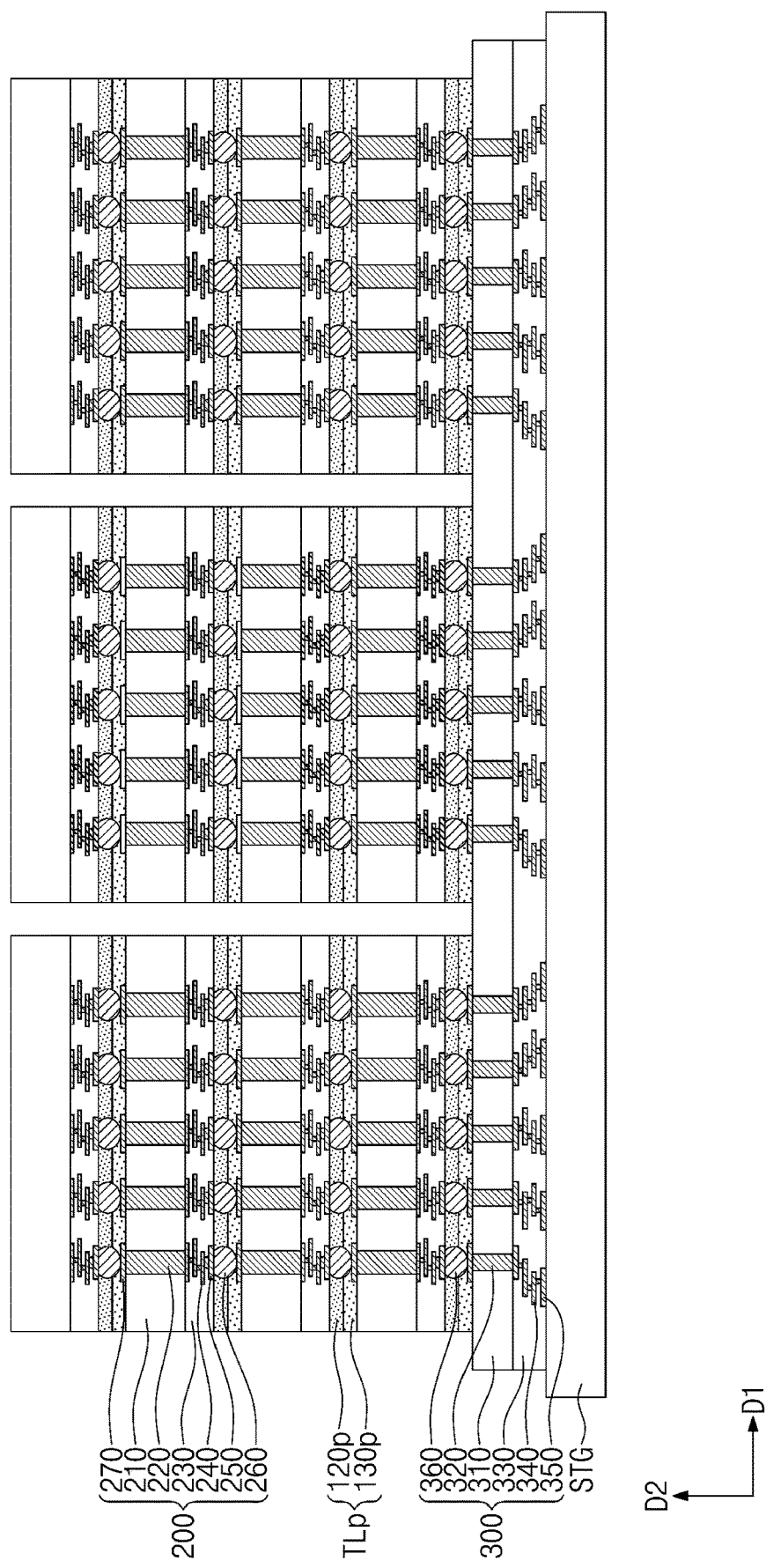
FIGS. 13 to 15 are cross-sectional views of stages in a method of fabricating a semiconductor package, according to an embodiment.
Figure 14:
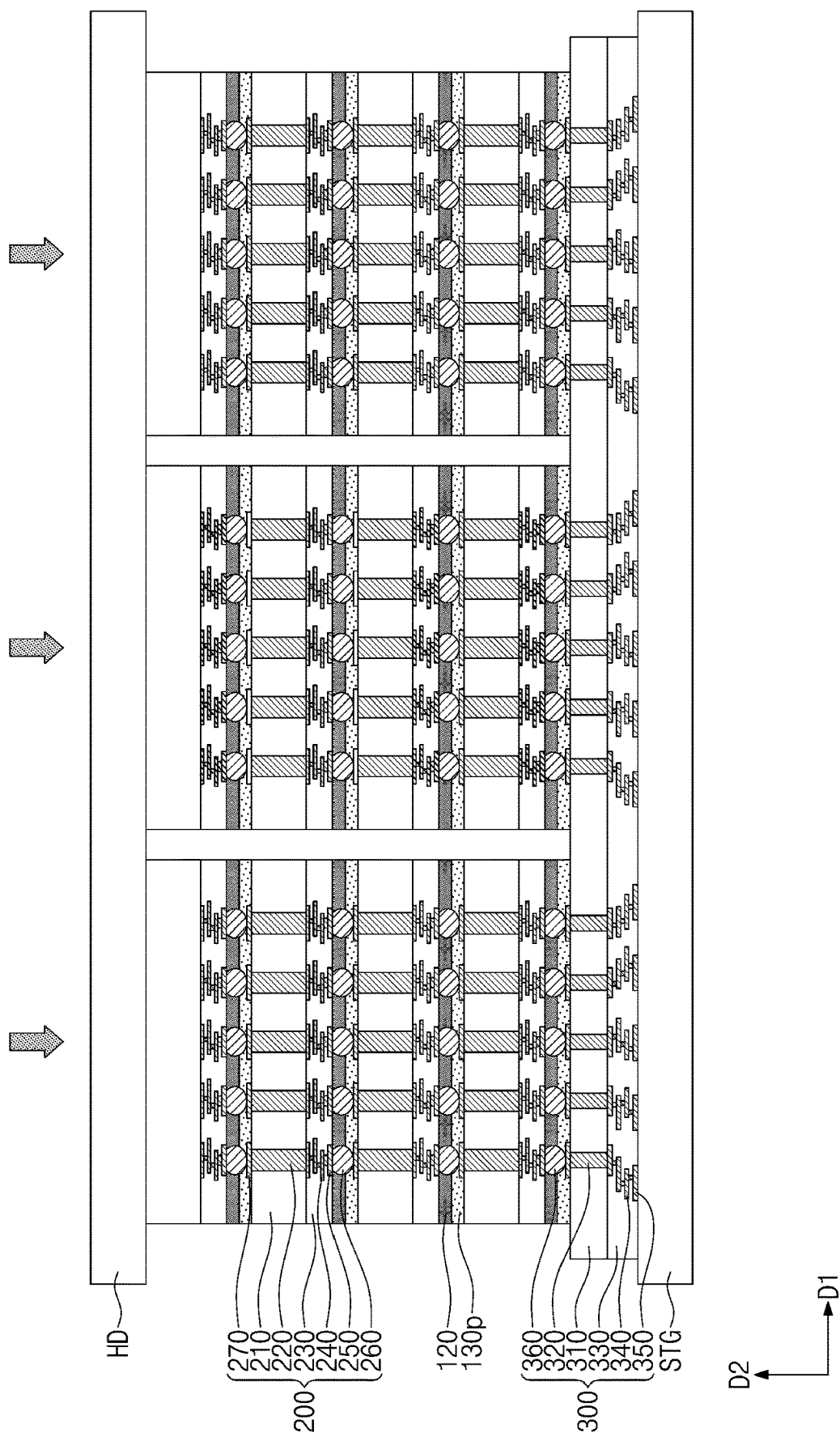
Figure 15:
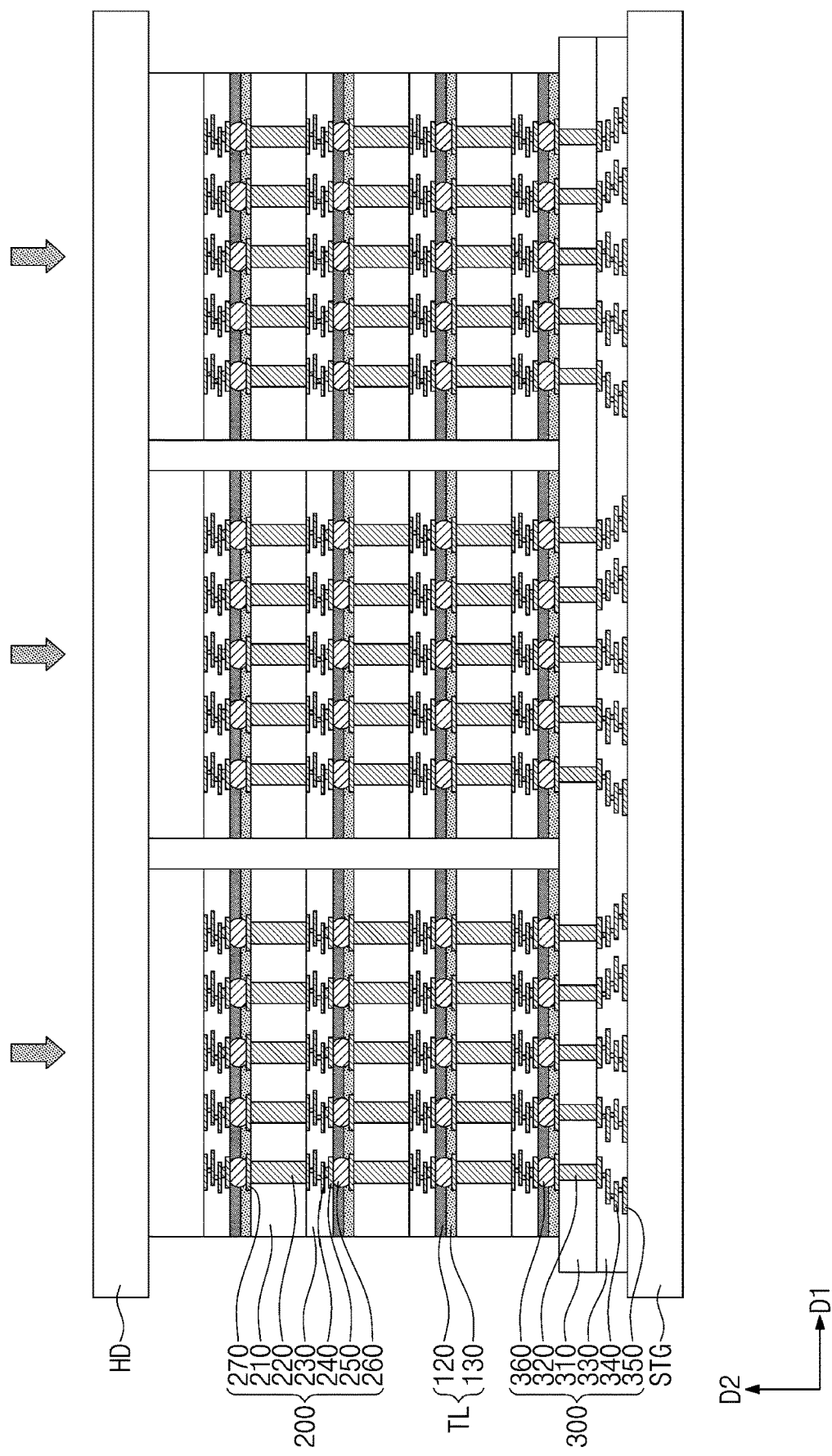

FIGS. 13 to 15 are cross-sectional views illustrating stages in a method of fabricating a semiconductor package, according to an embodiment. For ease of description, a previously described element may be identified by the same reference number without repeating an overlapping description thereof.

Referring to FIG. 13, the semiconductor chips 200 may be prepared by the same method as described with reference to FIGS. 3 and 4, and in this case, the preliminary curing layer TLp may be attached to the bottom surfaces 230b of the semiconductor chips 200. The interposer substrate 300 may be prepared. The interposer substrate 300 may be substantially the same as the interposer substrate 300 described with reference to FIG. 1. The preliminary chip stacks STp may be formed by stacking the semiconductor chips 200, to which the preliminary curing layer TLp is attached, on the interposer substrate 300. The semiconductor chips 200 of each of the preliminary chip stacks STp may be vertically aligned to each other, and the preliminary chip stacks STp may be horizontally spaced apart from each other.

Referring to FIG. 14, the pressure head HD may be disposed on the preliminary chip stacks STp. The pressure head HD may be vertically moved to perform the first pressing and heating process. The first pressing and heating process may include applying both of heat and pressure to the preliminary chip stacks STp. In the first pressing and heating process, the temperature of the pressure head HD may be maintained within a range from about 110° C. to about 120° C., and the temperature of the stage STG may be maintained at about 50° C. Due to the heating of the pressure head HD and the stage STG, a region near the preliminary chip stacks STp may be maintained at a temperature that is higher than or equal to a curing temperature of the thermo-curing agent in the first preliminary curing layers 120p and is lower than or equal to a curing temperature of the thermo-curing agent in the second preliminary curing layers 130p. Accordingly, the first curing layers 120 may be formed by a curing reaction, which is carried out in the first preliminary curing layers 120p. At this time, the second preliminary curing layers 130p may not be cured.

Referring to FIG. 15, the second pressing and heating process may be performed on the preliminary chip stacks STp, after the first pressing and heating process. The second pressing and heating process may include applying both of heat and pressure to the preliminary chip stacks STp. In the second pressing and heating process, the temperature of the pressure head HD may be maintained at about 320° C., and the temperature of the stage STG may be maintained at about 70° C. Due to the heating of the pressure head HD and the stage STG, temperature near the preliminary chip stacks STp may be maintained to be equal to or higher than a curing temperature of the thermo-curing agent in the second preliminary curing layers 130p. Accordingly, the second curing layers 130 may be formed by a curing reaction, which is carried out in the second preliminary curing layers 130p, and the semiconductor chips 200 may be more robustly fixed by the curing layer TL to form the chip stacks ST. Thereafter, the semiconductor package 1 according to an embodiment may be fabricated by forming the mold layer 500 and the outer connection terminals 400 using the method described with reference to FIG. 6.

By way of summation and review, embodiments provide a semiconductor package with improved reliability. That is, according to embodiments, a curing layer may be provided between vertically-stacked semiconductor chips. The curing layer may have a double-layered structure including a first curing layer and a second curing layer. The first curing layer may be in contact with an upper portion of a solder bump and may be firstly cured, and thus, the first curing layer may prevent the solder bumps of a fine pitch from being expanded in a lateral direction. Accordingly, it may be possible to prevent a short failure, which may occur when the solder bumps of the fine pitch are connected to each other.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
an interposer substrate;
outer connection terminals on a bottom surface of the interposer substrate;
chip stacks on the interposer substrate, each of the chip stacks including semiconductor chips and curing layers, which are vertically and alternately stacked; and
a mold layer on the interposer substrate to cover side surfaces of the chip stacks and a top surface of the interposer substrate,
wherein each of the semiconductor chips includes:
a semiconductor substrate,
a penetration structure penetrating the semiconductor substrate,
a circuit insulating layer and interconnection lines on a bottom surface of the semiconductor substrate,
a lower pad connected to the interconnection lines,
an upper pad on the semiconductor substrate, the penetration structure connecting the upper pad to the interconnection lines, and
a solder bump on a bottom surface of the lower pad, the solder bump being between the bottom surface of the lower pad and a top surface of the upper pad, and
wherein each of the curing layers includes:
a first curing layer in direct contact with an upper portion of the solder bump of one of the semiconductor chips and in direct contact with only the bottom surface of all surfaces of the lower pad, the first curing layer including a photo-curing agent, and
a second curing layer in direct contact with a lower portion of the solder bump of the one of the semiconductor chips and in direct contact with the top surface of the upper pad, the second curing layer including a thermo-curing agent.

2. The semiconductor package as claimed in claim 1, wherein the first curing layer further includes an additional thermo-curing agent.

3. The semiconductor package as claimed in claim 2, wherein the photo-curing agent includes a peroxide-based material, and the additional thermo-curing agent includes an amine-based material.

4. The semiconductor package as claimed in claim 1, wherein the photo-curing agent is activated by light having a wavelength from 10 nm to 400 nm.

5. The semiconductor package as claimed in claim 1, wherein a thickness of each of the first curing layer and the second curing layer is 0.1 µm to 20 µm.

6. The semiconductor package as claimed in claim 1, wherein a content of the photo-curing agent in the first curing layer is 0.1 phr to 5 phr, based on a total weight of a polymer resin in the first curing layer.

7. The semiconductor package as claimed in claim 1, wherein the first curing layer and the second curing layer independently include epoxy-based polymers, poly(bismaleimide)-based polymers, or acrylate-based polymers.

8. The semiconductor package as claimed in claim 1, wherein each of the first and second curing layers further includes filler particles, and a mean width of the filler particles is 10 nm to 10 µm.

9. The semiconductor package as claimed in claim 1, wherein a ratio of a thickness of the second curing layer to a height of the solder bump is 0.1 to 1.

10. A semiconductor package, comprising:
chip stacks, each of the chip stacks including semiconductor chips and curing layers vertically and alternately stacked; and
a mold layer covering side surfaces of the chip stacks, wherein each of the semiconductor chips includes:
a semiconductor substrate,
a penetration structure penetrating the semiconductor substrate,
a circuit insulating layer and interconnection lines on a bottom surface of the semiconductor substrate,
a lower pad connected to the interconnection lines,
an upper pad on the semiconductor substrate, the penetration structure connecting the upper pad to the interconnection lines, and
a solder bump on a bottom surface of the lower pad, the solder bump being between the bottom surface of the lower pad and a top surface of the upper pad, and
wherein each of the curing layers includes:
a first curing layer including a first thermo-curing agent, the first curing layer being in direct contact with the solder bump and in direct contact with the bottom surface of the lower pad, and the lower pad being entirely above the first curing layer; and a second curing layer between the first curing layer and a top surface of a corresponding one of the semiconductor chips, the second curing layer including a second thermo-curing agent, a curing temperature of the first thermo-curing agent being lower than a curing temperature of the second thermo-curing agent, and the second curing layer being in direct contact with the solder bump and in direct contact with a top surface of the upper pad.

11. The semiconductor package as claimed in claim 10, wherein the first thermo-curing agent includes a peroxide-based material, and the second thermo-curing agent includes an amine-based material.

12. The semiconductor package as claimed in claim 10, wherein a thickness of the second curing layer is 0.1 μm to 20 μm.

13. The semiconductor package as claimed in claim 10, wherein a ratio of a thickness of the first curing layer to a height of the solder bump is 0.1 to 1.

14. The semiconductor package as claimed in claim 10, wherein the curing temperature of the first thermo-curing agent is 80° C. to 150° C., and the curing temperature of the second thermo-curing agent is 150° C. to 300° C.

15. The semiconductor package as claimed in claim 10, wherein each of the first and second curing layers further includes filler particles in each of the first and second curing layers, a content of the filler particles in each of the first and second curing layers is 20 wt % to 70 wt %, based on a total weight of each of the first and second curing layers, respectively.

16. The semiconductor package as claimed in claim 15, wherein the filler particles include silica particles or alumina particles, a mean width of the filler particles is 10 nm to 10 μm.

17. The semiconductor package as claimed in claim 10, wherein an interface between the first curing layer and the second curing layer is at a level between top and bottom surfaces of the solder bump.

\* \* \* \* \*